US012219853B2

United States Patent
Kim et al.

(10) Patent No.: US 12,219,853 B2
(45) Date of Patent: Feb. 4, 2025

(54) DISPLAY PANEL AND MANUFACTURING METHOD OF THE SAME

(71) Applicant: Samsung Display Co., Ltd., Yongin-si (KR)

(72) Inventors: Jinwon Kim, Hwaseong-si (KR); Buyong Kim, Goyang-si (KR); Sujin Kim, Seoul (KR); Kiheon Lee, Hwaseong-si (KR); Woo-Man Ji, Anyang-si (KR); Hoyeon Ji, Suwon-si (KR); Yongseok Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 606 days.

(21) Appl. No.: 17/528,376

(22) Filed: Nov. 17, 2021

(65) Prior Publication Data

US 2022/0223653 A1  Jul. 14, 2022

(30) Foreign Application Priority Data

Jan. 13, 2021  (KR) .......................... 10-2021-0004422

(51) Int. Cl.
*H10K 59/38* (2023.01)
*H10K 50/84* (2023.01)
*H10K 50/854* (2023.01)

(52) U.S. Cl.
CPC ............. *H10K 59/38* (2023.02); *H10K 50/84* (2023.02); *H10K 50/854* (2023.02)

(58) Field of Classification Search
CPC ....... H10K 50/84; H10K 50/854; H10K 59/38
USPC ........................................................ 313/512
See application file for complete search history.

(56) References Cited

U.S. PATENT DOCUMENTS

| | | | |
|---|---|---|---|
| 10,185,066 B2 | 1/2019 | Chae et al. | |
| 10,670,901 B2 | 6/2020 | Lee et al. | |
| 2018/0210282 A1* | 7/2018 | Song ................. | G02F 1/133514 |
| 2020/0258946 A1* | 8/2020 | Kim ..................... | H10K 50/115 |
| 2021/0159278 A1* | 5/2021 | Lee ......................... | H01L 27/156 |
| 2021/0333456 A1* | 10/2021 | Ishioka ............. | G02F 1/133555 |
| 2021/0351238 A1* | 11/2021 | Park ..................... | H10K 50/856 |
| 2022/0320182 A1* | 10/2022 | Kim ..................... | C09D 11/322 |
| 2024/0268159 A1* | 8/2024 | Sun ..................... | H10K 59/122 |
| 2024/0306465 A1* | 9/2024 | Tian ................... | H10K 59/8731 |

FOREIGN PATENT DOCUMENTS

| | | |
|---|---|---|
| KR | 1020180018945 A | 2/2018 |
| KR | 1020190057190 A | 5/2019 |
| KR | 1020200031750 A | 3/2020 |
| KR | 1020200110581 A | 9/2020 |

* cited by examiner

*Primary Examiner* — Christopher M Raabe
(74) *Attorney, Agent, or Firm* — CANTOR COLBURN LLP

(57) ABSTRACT

A display panel includes a display layer including a light emitting element generating a source light, a first color filter on the display layer, a first color control layer between the display layer and the first color filter and including a first surface facing the first display layer and a second surface facing the first color filter, and a plurality of capping layers encapsulating the first color control layer. Among the capping layers, a capping layer between the first surface of the first color control layer and the display layer has a first-first thickness that is different from a second-first thickness of a capping layer between the second surface of the first color control layer and the first color filter.

17 Claims, 10 Drawing Sheets

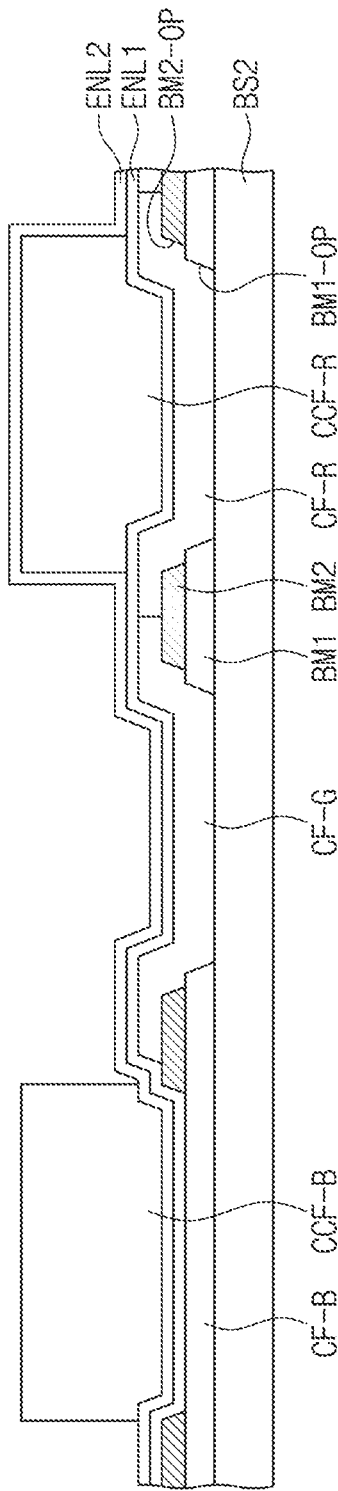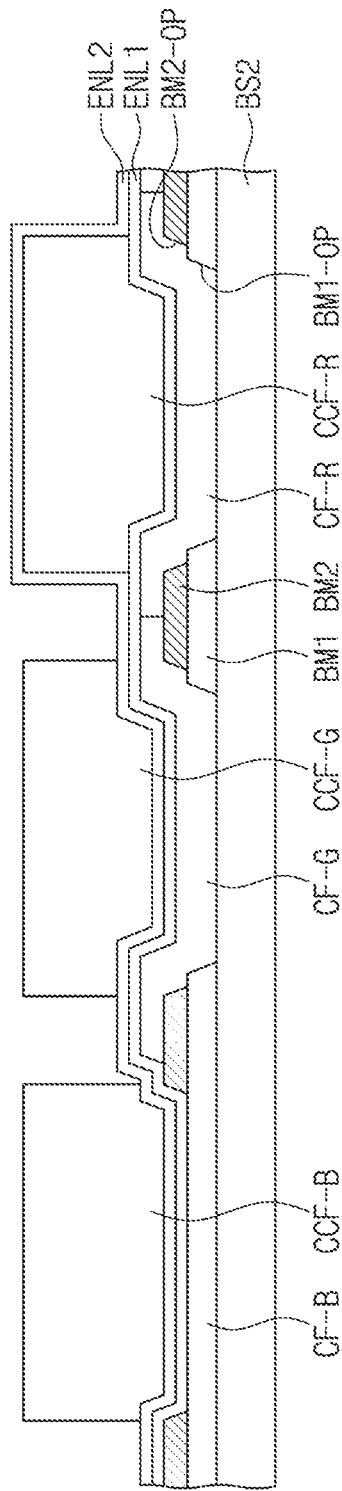

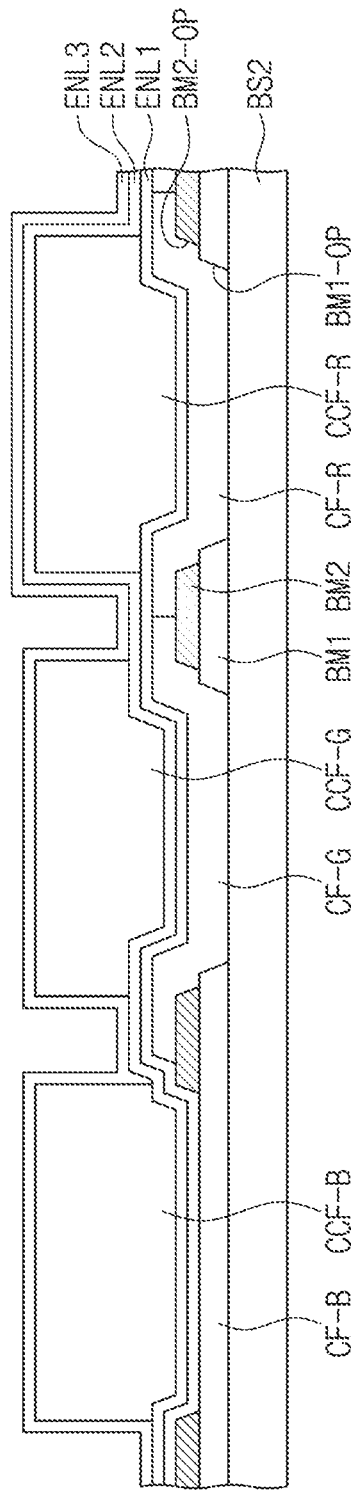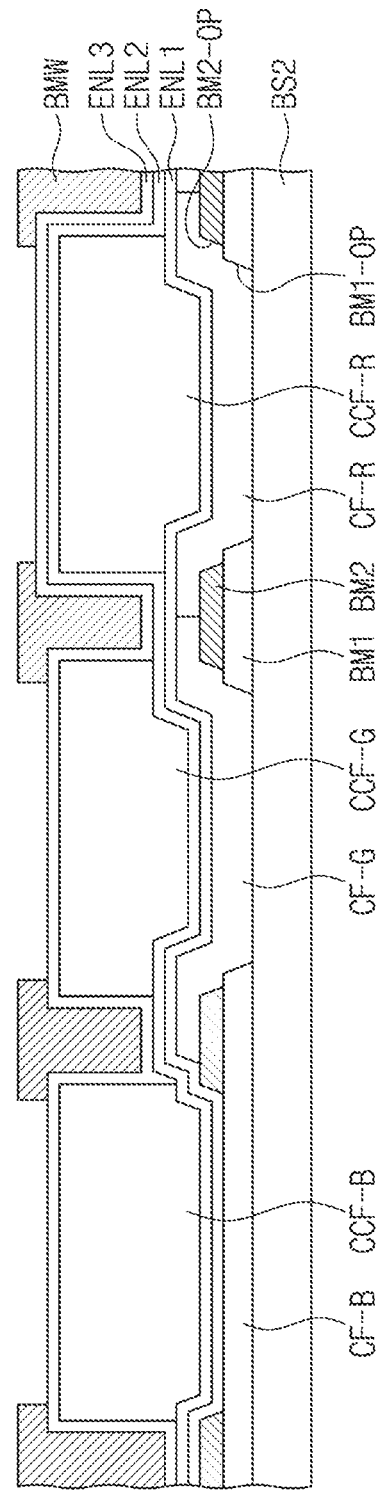

DISPLAY PANEL AND MANUFACTURING METHOD OF THE SAME

This application claims priority to Korean Patent Application No. 10-2021-0004422, filed on Jan. 13, 2021, and all the benefits accruing therefrom under 35 U.S.C. § 119, the contents of which are hereby incorporated by reference in its entirety.

BACKGROUND

1. Field

The disclosure relates to a display panel and method of providing the same. More particularly, the disclosure relates to a display panel having improved color purity and a method providing the same.

2. Description of the Related Art

Display panels are classified into a transmissive display panel that selectively transmits a source light generated by a light source and an emissive display panel that generates the source light. The display panel includes different types of color control layers depending on display pixels to generate color images. The color control layers transmit only a partial wavelength range of the source light or convert a color of the source light. Some color control layers change characteristics of the source light without changing the color of source light.

SUMMARY

The disclosure provides a display panel having improved color purity.

Embodiments provide a display panel including a first display layer including a light emitting element generating a source light, a first color filter on the first display layer in an emission direction of the source light, a first color control layer between the first display layer and the first color filter and including a first surface facing the first display layer and a second surface facing the first color filter, and a plurality of capping layers encapsulating the first surface and the second surface of the first color control layer. A capping layer between the first surface of the first color control layer and the first display layer among the capping layers has a first-first thickness that is different from a second-first thickness of a capping layer between the second surface of the first color control layer and the first color filter among the capping layers.

The capping layers may include first, second, and third capping layers, the first capping layer is between the second surface of the first color control layer and the first color filter, the second and third capping layers may be between the first surface of the first color control layer and the first display layer, and the second-first thickness may be smaller than the first-first thickness.

The display panel may further include a second color filter spaced apart from the first color filter and a second color control layer overlapping the second color filter, receiving the source light, providing a light different from a light generated by the first color control layer, and including a first surface facing the first display layer and a second surface facing the first color filter. The first and second capping layers may be between the second surface of the second color control layer and the second color filter, and the third capping layer may be between the first surface of the second color control layer and the first display layer.

A capping layer between the second surface of the second color control layer and the second color filter among the capping layers may have a second-second thickness that is greater than a first-second thickness of a capping layer between the first surface of the second color control layer and the first display layer among the capping layers.

Each of the first color control layer and the second color control layer may include a quantum dot.

The display panel may further include a third color filter spaced apart from the second color filter and a third color control layer overlapping the third color filter, receiving the source light, providing a light different from a light generated by the first color control layer and the second color control layer.

The display panel may further include a division pattern in which at least a portion thereof overlaps a space between the first, second, and third color control layers.

The division pattern may include the same material as the third color filter.

The display panel may further include a division barrier wall in the space between the first, second, and third color control layers.

The second-first thickness may be smaller than the first-first thickness.

Embodiments provide a display panel including a first display layer including a light emitting element generating a source light, a first color filter on the first display layer in an emission direction of the source light, a second color filter on the first display layer in the emission direction of the source light and spaced apart from the first color filter, a first color control layer between the first color filter and the first display layer, a second color control layer between the second color filter and the first display layer, and a plurality of capping layers encapsulating the first color control layer and the second color control layer. Each of the first color control layer and the second color control layer includes a first surface facing the first display layer and a second surface opposing the first surface in the emission direction, and a capping layer between the second surface of the first color control layer and the first color filter among the capping layers has a second-first thickness that is different from a second-second thickness of a capping layer between the second surface of the second color control layer and the second color filter among the capping layers.

The capping layers may include first, second, and third capping layers, the first capping layer may be between the second surface of the first color control layer and the first color filter and between the second surface of the second color control layer and the second color filter, and the second capping layer may be between the first surface of the first color control layer and the first display layer and between the second surface of the second color control layer and the first capping layer.

The third capping layer may be between the second capping layer and the first display layer in an area overlapping the first color control layer and may be between the first surface of the second color control layer and the first display layer in an area overlapping the second color control layer.

The second-first thickness may be smaller than the second-second thickness.

A capping layer between the first surface of the first color control layer and the first display layer may have a first-first thickness that is greater than a first-second thickness of a capping layer between the first surface of the second color control layer and the first display layer.

The first-first thickness may be equal to the second-second thickness.

Each of the first color control layer and the second color control layer may include a quantum dot.

Embodiments of the inventive concept provide a method of manufacturing a display panel. The manufacturing method includes forming a first capping layer on a basement layer, performing a first heat-treating process on the basement layer to form a first color control layer including a quantum dot, forming a second capping layer that encapsulates the first color control layer with the first capping layer, and forming a second color control layer including a quantum dot different from the quantum dot of the first color control layer and a third color control layer including scattering particles on the second capping layer.

At least one of the second color control layer and the third color control layer is formed by a heat-treating process after the forming of the second capping layer.

The method further includes forming a third capping layer that encapsulates the second color control layer and the third color control layer with the second capping layer after the forming of the third color control layer.

According to the above, the display panel includes the color control layer with stable efficiency. Thus, reliability of the display panel is improved.

BRIEF DESCRIPTION OF THE DRAWINGS

The above and other advantages of the invention will become readily apparent by reference to the following detailed description when considered in conjunction with the accompanying drawings where:

FIGS. 6A to 6F are cross-sectional views showing an embodiment of a method of providing a display panel.

DETAILED DESCRIPTION

Figure 1A:
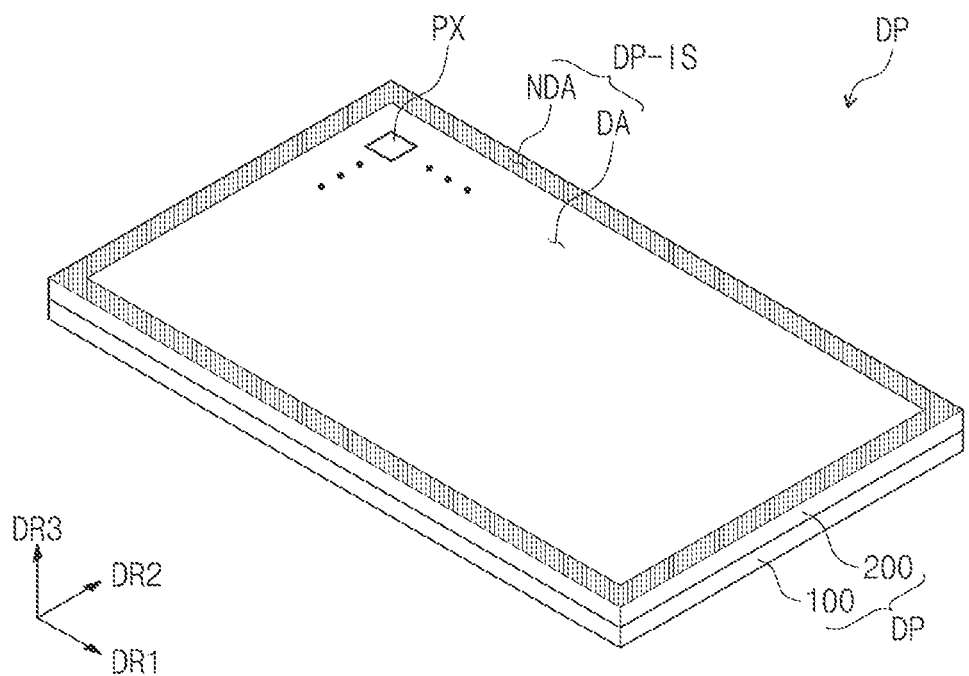
FIG. 1A is a perspective view showing an embodiment of a display panel.

In the disclosure, it will be understood that when an element or layer is referred to as being related to another element such as being "on", "connected to" or "coupled to" another element or layer, it can be directly on, connected or coupled to the other element or layer or intervening elements or layers may be present. In contrast, when an element or layer is referred to as being related to another element such as being "directly on", "directly connected to" or "directly coupled to" another element or layer, no other element or layer or intervening elements or layers are present.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numerals refer to like elements throughout. In the drawings, the thickness, ratio, and dimension of components are exaggerated for effective description of the technical content.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure.

The terminology used herein is for the purpose of describing particular embodiments only and is not intended to be limiting. As used herein, the singular forms, "a", "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the disclosure will be explained in detail with reference to the accompanying drawings.

Figure 1B:
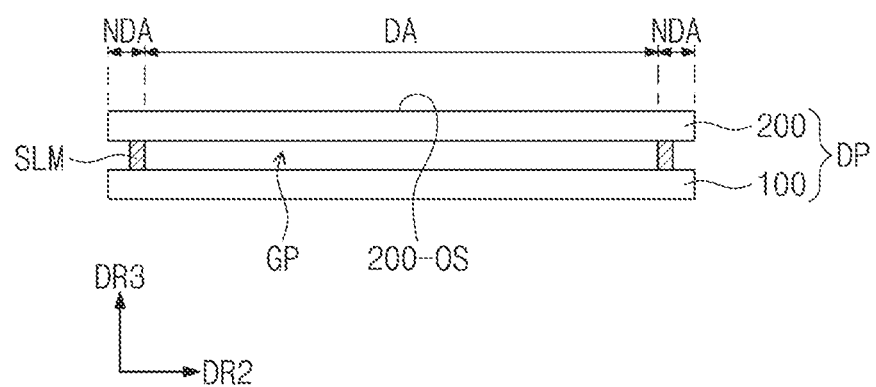
FIG. 1B is a cross-sectional view showing an embodiment of a display panel.
Figure 2:
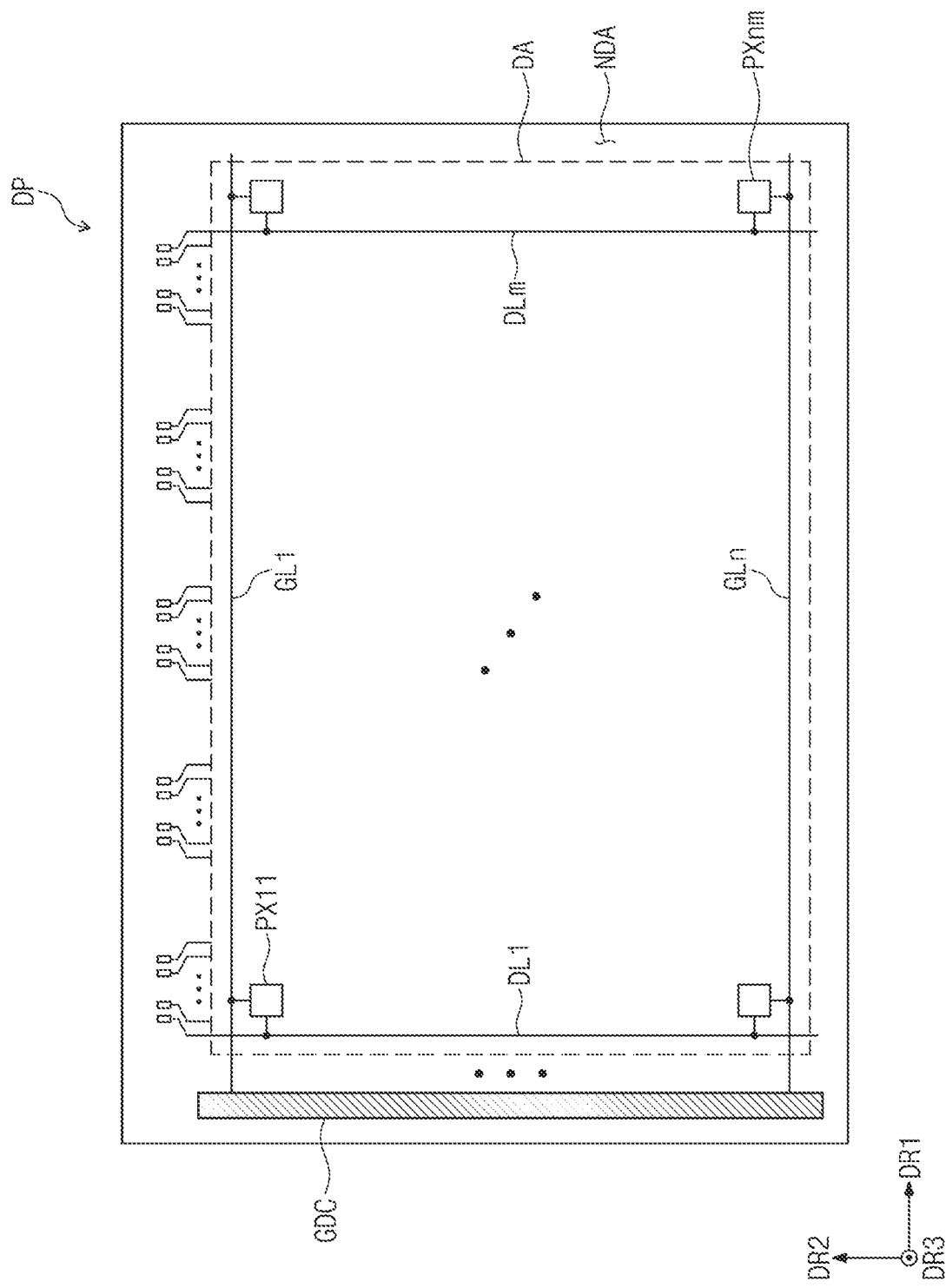
FIG. 2 is a plan view showing an embodiment of a display panel.

FIG. 1A is a perspective view showing an embodiment of a display panel DP FIG. 1B is an embodiment of a cross-sectional view of the display panel DP. FIG. 2 is a plan view of an embodiment of the display panel DP.

Referring to FIGS. 1A, 1B, and 2, the display panel DP may be one of a liquid crystal display panel, an electrophoretic display panel, a microelectromechanical system ("MEMS") display panel, an electrowetting display panel, an organic light emitting display panel, and an inorganic light emitting display panel, however, should not be particularly limited.

Although not shown in figures, the display panel DP may further include a chassis member and/or a molding member to define an outer appearance or outer surface of the display panel DP and/or a backlight unit providing light depending on a type of the display panel DP.

The display panel DP may include a first display layer 100 (hereinafter also a base layer 100) and a second display layer 200 (hereinafter also an upper display layer 200) which faces the first display layer 100 and is spaced apart from the first display layer 100. A cell gap GP may be defined between the first display layer 100 and the second display layer 200.

The cell gap GP may be maintained by a sealant SLM coupling the first display layer 100 and the second display layer 200 to each other. The sealant SLM may be disposed along an edge of the first display layer 100 and the second display layer 200 and may overlap a non-display area NDA.

A grayscale display layer may be disposed between the first display layer 100 and the second display layer 200 to generate an image. The grayscale display layer may include a liquid crystal layer, an organic light emitting layer, an inorganic light emitting layer, or an electrophoretic layer depending on the type of the display panel DP.

As shown in FIG. 1A, the display panel DP may display the image through a display surface DP-IS. An outer surface 200-OS of the second display layer 200 shown in FIG. 1B may define the display surface DP-IS of the display panel DP.

The display surface DP-IS may be substantially parallel to a plane defined by a first direction DR1 and a second direction DR2 crossing each other. The display surface DP-IS may include a display area DA and the non-display area NDA which is adjacent to the display area DA. A pixel PX may be disposed in the display area DA and may not be disposed in the non-display area NDA (e.g., may be excluded from the non-display area NDA). The non-display area NDA may be defined along an edge (e.g., outer edge) of the display surface DP-IS. The non-display area NDA may surround the display area DA, however, is not limited thereto or thereby. According to an embodiment, the non-display area NDA may be omitted or may be disposed at only one side of the display area DA along the plane defined by the first direction DR1 and the second direction DR2 which cross each other. Various components or layers of the display panel DP may including a display area DA and a non-display area NDA corresponding to those described above.

A third direction DR3 may indicate a normal line direction of the display surface DP-IS, e.g., a thickness direction of the display panel DP. Front (or upper) and rear (or lower) surfaces of each layer or each unit are distinguished from each other along the third direction DR3. However, the first, second, and third directions DR1, DR2, and DR3 described are merely one example.

According to an embodiment, the display panel DP may include the display surface DP-IS that is a flat type, however, the display surface DP-IS should not be limited to the flat type. The display panel DP may include a curved type display surface or a three-dimensional display surface. The three-dimensional display surface may include plural display areas that face different directions from each other.

FIG. 2 shows an embodiment of an arrangement between signal lines GL1 to GLn and DL1 to DLm, and pixels PX11 to PXnm, along a plane. The signal lines GL1 to GLn and DL1 to DLm may include a plurality of gate lines GL1 to GLn and a plurality of data lines DL1 to DLm.

Each of the pixels PX11 to PXnm may be connected to a corresponding gate line among the gate lines GL1 to GLn and a corresponding data line among the data lines DL1 to DLm. Each of the pixels PX11 to PXnm may include a pixel driving circuit and a display element which is connected to the pixel driving circuit to be controlled by the pixel driving circuit. Various signal lines may be provided in the display panel DP according to a configuration of the pixel driving circuit.

FIG. 2 shows the pixels PX11 to PXnm arranged in a matrix form, however, the arrangement of the pixels PX11 to PXnm should not be limited to the matrix form. The pixels PX11 to PXnm may be arranged in a pentile pattern. A gate driving circuit GDC may be integrated in the display panel DP through an oxide semiconductor gate driver circuit ("OSG") process or an amorphous silicon gate driver circuit ("ASG") process.

Figure 3A:
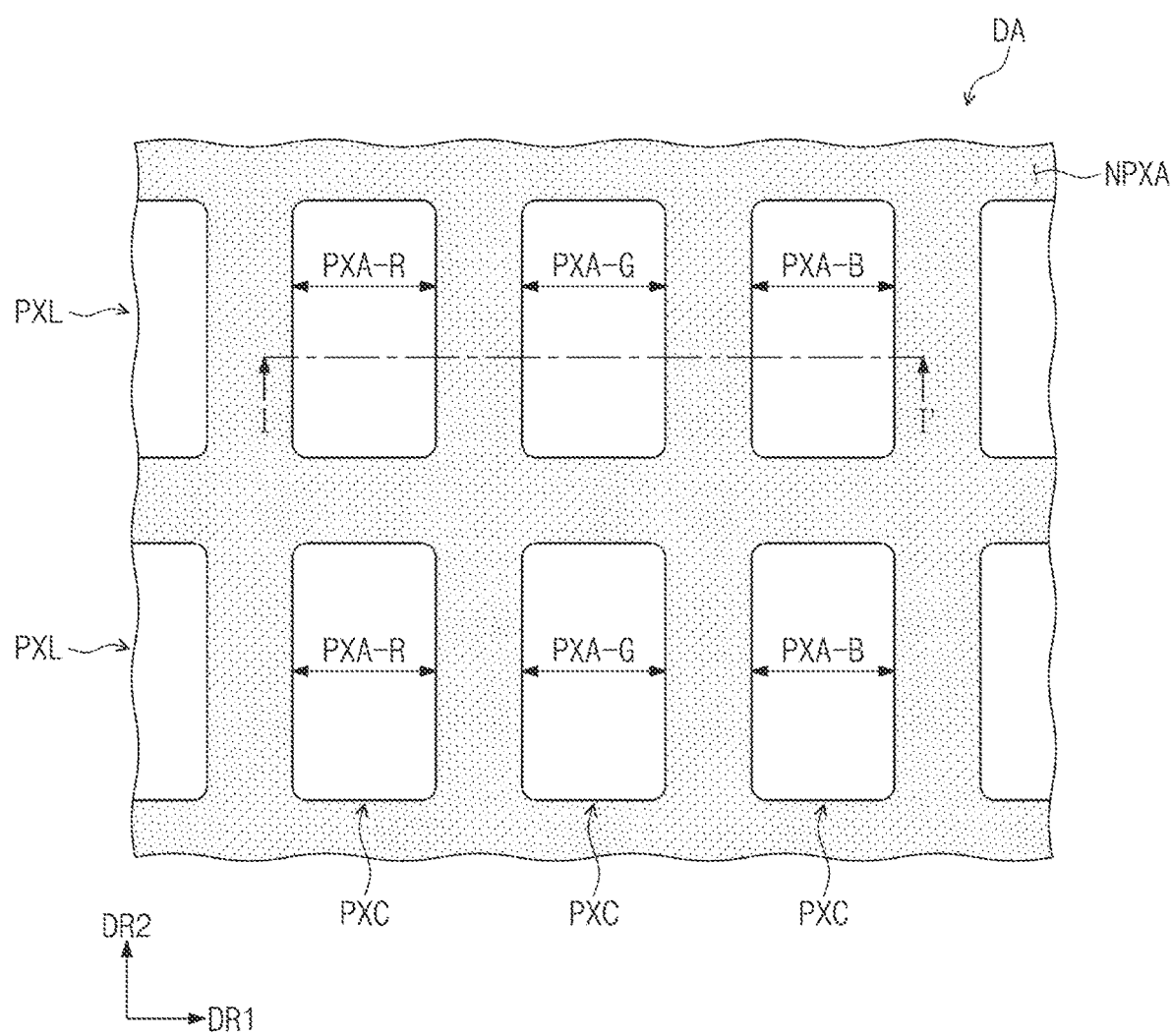
FIG. 3A is a plan view showing an embodiment of a display area of a display panel.
Figure 3B:
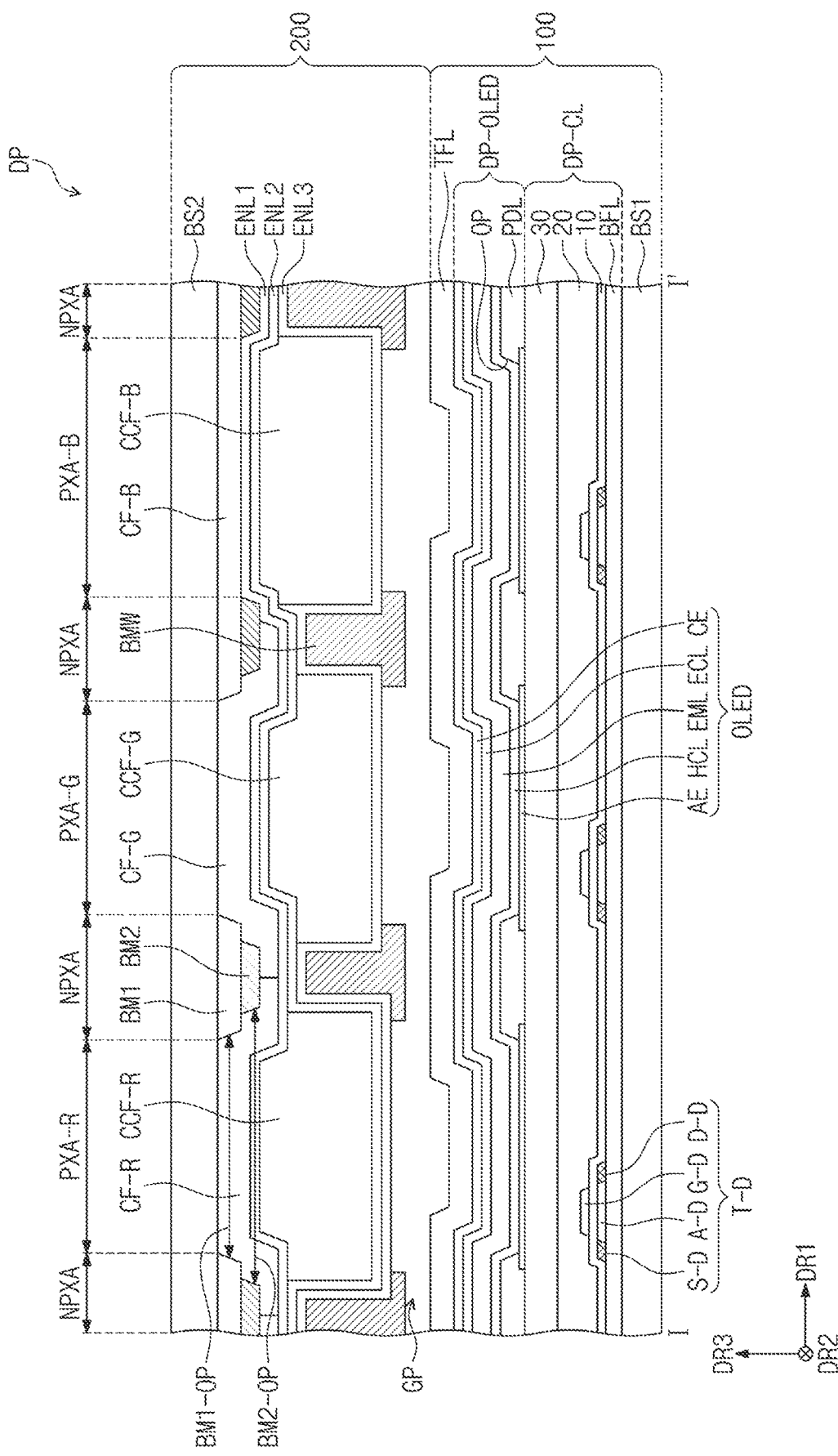
FIG. 3B is a cross-sectional view taken along line I-I' of FIG. 3A.
Figure 3C:
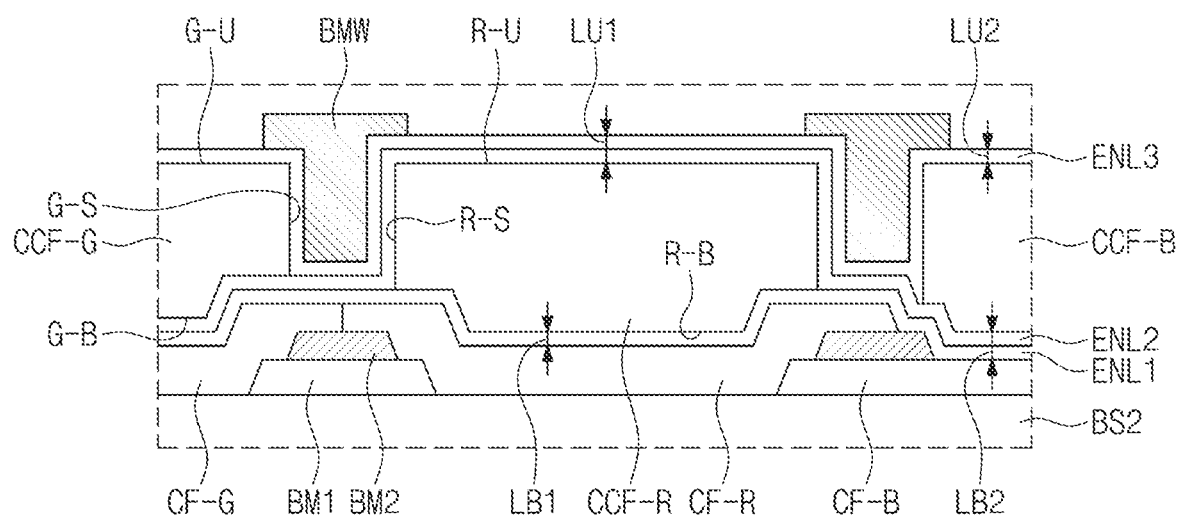
FIG. 3C is an enlarged cross-sectional view showing an embodiment of an area of a second display layer.

FIG. 3A is a plan view showing an embodiment of the display area DA of the display panel DP FIG. 3B is a cross-sectional view taken along line I-I' of FIG. 3A. FIG. 3C is an enlarged cross-sectional view showing an embodiment of an area of the second display layer 200.

FIG. 3A shows a plurality of pixel areas PXA-R, PXA-G, and PXA-B when viewed in a direction from the external surface 200-OS of the second display layer 200 shown in FIG. 1B and along the third direction DR3. A group among the pixel areas PXA-R, PXA-G, and PXA-B may be arranged in a pixel row PXL. Referring to FIG. 3A, for example, the plurality of pixel areas PXA-R, PXA-G, and PXA-B includes six pixel areas arranged in two pixel rows PXL.

In an embodiment, three types of the pixel areas PXA-R, PXA-G, and PXA-B may be repeatedly arranged in the display area DA. A peripheral area NPXA may be defined adjacent to and/or around first, second, and third pixel areas PXA-R, PXA-G, and PXA-B. The peripheral area NPXA may define a boundary between the first, second, and third pixel areas PXA-R, PXA-G, and PXA-B which are adjacent to each other and may reduce or effectively prevent a color mixture between lights respective emitted from the first, second, and third pixel areas PXA-R, PXA-G, and PXA-B.

The first, second, and third pixel areas PXA-R, PXA-G, and PXA-B having the same size in a plane (e.g., planar size) are shown as a representative example, however, should not be limited thereto or thereby. At least two of the first, second, and third pixel areas PXA-R, PXA-G, and PXA-B may have different planar sizes from each other.

FIG. 3A shows the first, second, and third pixel areas PXA-R, PXA-G, and PXA-B having a rectangular shape (e.g., planar shape) with a rounded corner, however, should not be limited thereto or thereby. When viewed in a plane, the first, second, and third pixel areas PXA-R, PXA-G, and PXA-B may have a variety of planar shapes and should not be particularly limited.

Among the first, second, and third pixel areas PXA-R, PXA-G, and PXA-B, one pixel area may provide a third color light corresponding to a source light, another pixel area may provide a first color light different from the third color light, and the other pixel area may provide a second color light different from the third color light and the first color light.

In an embodiment, the third pixel area PXA-B may provide the third color light. As an example, the first pixel area PXA-R may provide a red light, the second pixel area PXA-G may provide a green light, and the third pixel area PXA-B may provide a blue light.

FIG. 3B shows a cross-section corresponding to a driving transistor T-D and a light emitting element OLED. The upper display layer 200 and base layer 100 may define the cell gap GP. The first display layer 100 may include the light emitting element OLED generating and emitting a source light in an emission direction of the display panel DP.

As shown in FIG. 3B, base layer 100 (first display layer 100) may include a first base layer BST, a circuit element layer DP-CL disposed on the first base layer BST, a display element layer DP-OLED disposed on the circuit element layer DP-CL, and an encapsulation layer TFL.

The first base layer BST may include a plastic substrate or a glass substrate. The circuit element layer DP-CL may include at least one insulating layer and a circuit element. The circuit element may include a signal line and a pixel driving circuit. The circuit element layer DP-CL may include or be formed by a process of forming (or providing) an insulating layer, a semiconductor layer, and a conductive layer by coating and depositing processes, and a process of patterning the insulating layer, the semiconductor layer, and the conductive layer by a photolithography process.

According to an embodiment, the circuit element layer DP-CL may include a buffer layer BFL, a first insulating layer 10, a second insulating layer 20, and a third insulating layer 30. The buffer layer BFL, the first insulating layer 10, and the second insulating layer 20 may be an inorganic layer, and the third insulating layer 30 may be an organic layer.

FIG. 3B shows an embodiment of an arrangement of an active A-D (e.g., active region), a source S-D, a drain D-D, and a gate G-D that form the driving transistor T-D. The active A-D, the source S-D, and the drain D-D may be distinguished from each other with a semiconductor pattern according to a doping concentration or a conductivity of the semiconductor pattern.

The display element layer DP-OLED may include the light emitting element OLED. The light emitting element OLED may generate a source light. An emission direction of the source light may be in a direction from the first display layer 100 to the second display layer 200 (e.g., upward in the third direction DR3 in FIG. 3B). The light emitting element OLED may include a first electrode AE, a second electrode CE, and a light emitting layer EML disposed between the first electrode AE and the second electrode CE. According to an embodiment, the display element layer DP-OLED may include an organic light emitting diode as a light emitting element OLED. The display element layer DP-OLED may include a pixel definition layer PDL. As an example, the pixel definition layer PDL may be, but not limited to, an organic layer.

The first electrode AE may be disposed on the third insulating layer 30. The first electrode AE may be connected directly or indirectly to the driving transistor T-D. In FIG. 3B, a connection structure between the first electrode AE and the driving transistor T-D is not shown. An opening OP may be defined through the pixel definition layer PDL by solid portions thereof. At least a portion of the first electrode AE may be exposed to outside the pixel definition layer PDL through the opening OP of the pixel definition layer PDL.

A hole control layer HCL, the light emitting layer EML, and an electron control layer ECL may be commonly disposed in the first, second, and third pixel areas PXA-R, PXA-G, and PXA-B (refer to FIG. 3A), however, should not be limited thereto or thereby. The light emitting layer EML may be disposed to correspond to the opening OP respectively corresponding to each of the first, second, and third pixel areas PXA-R, PXA-G, and PXA-B (refer to FIG. 3A) after being patterned from a light emitting material layer.

The hole control layer HCL may include a hole transport layer and may further include a hole injection layer. The light emitting layer EML may generate the blue light. The blue light may have a wavelength from about 410 nanometers (nm) to about 480 nm. A light emission spectrum of the blue light may have a maximum peak within a range from about 440 nm to about 460 nm. The electron control layer ECL may include an electron transport layer and may further include an electron injection layer. The light emitting layer EML may be commonly disposed in the first, second, and third pixel areas PXA-R, PXA-G, and PXA-B or may be independently disposed as light emitting patterns in corresponding first, second, and third pixel areas PXA-R, PXA-G, and PXA-B after being patterned from a light emitting material layer.

The encapsulation layer TFL may be disposed on the second electrode CE. The encapsulation layer TFL may have a multi-layer structure in which an organic layer including an organic material and an inorganic layer including an inorganic material are stacked. The encapsulation layer TFL may have an encapsulation structure of inorganic layer/organic layer/inorganic layer sequentially stacked along the third direction DR3. The encapsulation layer TFL may further include a refractive-index control layer to improve a light emission efficiency.

Base layer 100 may include first, second, and third display elements respectively corresponding to the first, second, and third pixel areas PXA-R, PXA-G, and PXA-B shown in FIG. 3A. The first, second, and third display elements may have the same stacked structure as each other and may have a stacked structure corresponding to the stack structure of the light emitting element OLED shown in FIG. 3B.

As shown in FIG. 3B, the upper display layer 200 (the second display layer 200) may include a second base layer BS2, division patterns BM1 and BM2, color filters CF-R, CF-G, and CF-B (e.g., color filter layer), color control layers CCF-R, CCF-G, and CCF-B (e.g., color control layer), and a division barrier wall BMW (e.g., barrier wall). In addition, the upper display layer 200 may include a plurality of capping layers ENL1, ENL2, and ENL3.

The second base layer BS2 may include a plastic substrate or a glass substrate. A first division pattern BM1 may be disposed on the second base layer BS2.

An arrangement relation between components included in the second display layer 200 will be described according to a process sequence of manufacturing or providing the second display layer 200 shown in FIGS. 6A to 6F. In FIG. 3B, the division barrier wall BMW may be a component disposed on the encapsulation layer TFL, however, the division barrier wall BMW may be a component that is formed or providing last and coupled to the first display layer 100.

Accordingly, hereinafter, the arrangement between the components included in the second display layer 200 will be described based on the second base layer BS2 on which the components are disposed.

The first division pattern BM1 may overlap or correspond to the peripheral area NPXA. Substantially, a first opening BM1-OP corresponding to at least one of the first, second, and third pixel areas PXA-R, PXA-G, and PXA-B may be defined by solid portions of the first division pattern BM1.

The first opening BM1-OP may be defined differently according to optical properties of the first division pattern BM1. In an embodiment, the first division pattern BM1 may include substantially the same material as that of a third color filter CF-B. In this case, the first opening BM1-OP corresponding to each of the first and second pixel areas PXA-R and PXA-G may be defined by the first division pattern BM1, and a first opening BM1-OP corresponding to the third pixel area PXA-B may be omitted. Accordingly, the first division pattern BM1 and the third color filter CF-B may be substantially simultaneously formed with each other. In an embodiment, as being the first division pattern BM1 and the third color filter CF-B may be respective patterns of a same material layer without being limited thereto.

In an embodiment, the first division pattern BM1 may be provided integrally with the third color filter CF-B, and thus, a reflectance of an external light at an interface between the second base layer BS2 and the third color filter CF-B may be reduced. Accordingly, a visibility of the display panel DP may be improved.

However, the first division pattern BM1 and the third color filter CF-B should not be limited thereto or thereby. The first division pattern BM1 may be a black matrix that blocks most of an entire wavelength range of a visible light. In this case, the first division pattern BM1 may be disposed in the peripheral area NPXA which is adjacent to the third pixel area PXA-B such that the first opening BM1-OP is defined in an area overlapping or corresponding to the third pixel area PXA-B.

A second division pattern BM2 may be disposed on the first division pattern BM1. A second opening BM2-OP may be defined by solid portions of the second division pattern BM2 to correspond to each of the first, second, and third pixel areas PXA-R, PXA-G, and PXA-B. The second opening BM2-OP of the second division pattern BM2 corresponding to the first and second pixel areas PXA-R and PXA-G may have a planar size greater than a planar size of the first opening BM1-OP of the first division pattern BM1 corresponding to the first and second pixel areas PXA-R and PXA-G. Referring to FIG. 3B, for example, a dimension of the second opening BM2-OP along the first direction DR1 is greater than a dimension of the first opening BM1-OP along the same direction.

Among the second openings of the second division pattern BM2, one of the second opening BM2-OP overlapping the third pixel area PXA-B may define the third pixel area PXA-B. The second division pattern BM2 may be a black matrix.

However, embodiments should not be limited thereto or thereby, and the second division pattern BM2 may be disposed between the second base layer BS2 and the first division pattern BM1, or the second division pattern BM2 may be omitted.

In one or more embodiment, as the display panel DP includes the division patterns BM1 and BM2 disposed on the second base layer BS2, mixing of different colors of lights respectively controlled by the color control layers CCF-R, CCF-G, and CCF-B may be reduced or effectively prevented. Thus, a color reproducibility of the display panel DP may be improved.

In an embodiment, first, second, and third color filters CF-R, CF-G, and CF-B may be disposed on the second base layer BS2 to respectively correspond to the first, second, and third pixel areas PXA-R, PXA-G, and PXA-B. The first, second, and third color filters CF-R, CF-G, and CF-B may include a pigment and/or a dye that absorb(s) different wavelength bands from each other. The first color filter CF-R may be a red color filter, the second color filter CF-G may be a green color filter, and the third color filter CF-B may be a blue color filter.

A first capping layer ENL1 may be disposed on the first, second, and third color filters CF-R, CF-G, and CF-B. The first capping layer ENL1 may cover the first, second, and third color filters CF-R, CF-G, and CF-B. The first capping layer ENL1 may be commonly disposed in the first, second, and third pixel areas PXA-R, PXA-G, and PXA-B.

The first capping layer ENL1 may include an inorganic material. As an example, the first capping layer ENL1 may include one of silicon oxide, silicon nitride, or silicon oxynitride.

As used throughout this disclosure, the term "basement layer" may mean a structure in which the first, second, and third color filters CF-R, CF-G, and CF-B are formed or provided on the second base layer BS2. Accordingly, the first capping layer ENL1 may be formed or provided on the second base layer BS2.

In an embodiment, first, second, and third color control layers CCF-R, CCF-G, and CCF-B may be disposed on the first capping layer ENL1 to respectively correspond to the first, second, and third pixel areas PXA-R, PXA-G, and PXA-B. At least one of the first, second, and third color control layers CCF-R, CCF-G, and CCF-B may absorb the source light generated by the light emitting element OLED and may generate a light having a color different from that of the source light. That is, at least one of the first, second, and third color control layers CCF-R, CCF-G, and CCF-B may convert a color of the source light to a light having a different color from the source light (e.g., color-converts the source light having a first color to a light having a second color different from the first color of the source light). One of the first, second, and third color control layers CCF-R, CCF-G, and CCF-B may transmit the source light incident thereto without converting the color of the source light.

As an example, the first color control layer CCF-R may absorb the blue light (e.g., source light) and may generate the red light, the second color control layer CCF-G may absorb the blue light and may generate the green light. That is, the first color control layer CCF-R and the second color control layer CCF-G may include different color conversion materials (e.g., quantum dots) from each other. The third color control layer CCF-B may transmit the blue light.

The first, second, and third color control layers CCF-R, CCF-G, and CCF-B may extend along the second direction DR2 and may be arranged along the first direction DR1 in a stripe shape to be spaced apart from each other. In an embodiment, the stripe shape may a major dimension along the second direction DR2 (e.g., length) and bet arranged spaced apart from each other along the first direction DR1. The first, second, and third color control layers CCF-R, CCF-G, and CCF-B may be arranged in the unit of a pixel column PXC shown in FIG. 3A. As an example, one color control layer among the first, second, and third color control layers CCF-R, CCF-G, and CCF-B may overlap pixel rows PXL which are different from each other and spaced apart from each other along the second direction DR2. That is, the one color control layer may be common to more than one of the pixel rows PXL.

The first and second color control layers CCF-R and CCF-G may include a base resin and quantum dots combined with (or dispersed in) the base resin. As used herein, the first and second color control layers CCF-R and CCF-G may be defined as quantum dot layers.

The base resin may be a medium in which the quantum dots are dispersed and may include various resin compositions that are generally referred to as a binder, however, should not be limited thereto or thereby. In embodiments, any medium in which the quantum dots are dispersed may be referred to as the base resin regardless of its name, additional functions, constituent materials, etc. The base resin may be a polymer resin. In embodiments, for example, the base resin may be an acrylic-based resin, a urethane-based resin, a silicone-based resin, or an epoxy-based resin. The base resin may be a transparent resin.

The quantum dots may be particles that change a wavelength of light incident thereto (e.g., wavelength-converting). The quantum dots are a material having a crystal structure of several nanometers in size, contain hundreds to thousands of atoms, and exhibit a quantum confinement effect in which an energy band gap increases due to a small size. When a light having a wavelength with an energy higher than the band gap is incident into the quantum dots, the quantum dots absorb the light and become excited, and then, the quantum dots emit a light of a specific wavelength and fall to the ground state. The emitted light of the specific wavelength has a value corresponding to the band gap. The light-emitting property of the quantum dots due to the quantum confinement effect may be controlled by adjusting the size and composition of the quantum dots.

The quantum dots may be selected from a group II-VI compound, a group III-V compound, a group III-VI compound, a group I-III-VI compound, a group IV-VI compound, a group IV element, a group IV compound, and a combination thereof.

The group II-VI compound may be selected from a binary compound selected from CdSe, CdTe, Cds, ZnS, ZnSe, ZnTe, ZnO, HgS, HgSe, HgTe, MgSe, MgS, and a combination thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination, and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The group III-VI compound may include a binary compound of $In_2S_3$ or $In_2Se_3$, a ternary compound of $InGaS_3$ or $InGaSe_3$, or an arbitrary combination thereof.

The group I-III-VI compound may include a ternary compound selected from AgInS, $AgInS_2$, CuInS, $CuInS_2$, $AgGaS_2$, $CuGaS_2$, $CuGaO_2$, $AgGaO_2$, $AgAlO_2$, and a combination thereof, or a quaternary compound of $AgInGsS_2$, $CuInGaS_2$, or the like.

The group III-V compound may be selected from a binary compound selected from GaN, GaP, GaAs, GaSb, AlN, AlP, AlAs, AlSb, InN, InP, InAs, InSb, and a combination thereof, a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and a combination thereof, and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination. The group III-V compound may further include a group II metal. For instance, InZnP may be selected as a group III-II-V.

The group IV-VI compound may be selected from a binary compound among SnS, SnSe, SnTe, PbS, PbSe, PbTe, and a combination, a ternary compound selected from SnSeS, SnSeTe, SnSTe, PbSeS, PbSeTe, PbSTe, SnPbS, SnPbSe, SnPbTe, and a combination thereof, and a quaternary compound selected from SnPbSSe, SnPbSeTe, SnPbSTe, and a combination. The group IV element may be selected from Si, Ge, and a combination thereof. The group IV compound may be a binary compound selected from SiC, SiGe, and a combination thereof.

In this case, the binary compound, the ternary compound, or the quaternary compound may exist in the particles at a uniform concentration or may exist in the same particle after being divided into plural portions having different concentrations.

Each quantum dot may have a core-shell structure that includes a core having a nanocrystal and a shell surrounding the core. The shell of the quantum dot may serve as a protective layer to prevent chemical modification of the core and to maintain semiconductor properties and/or as a charging layer to impart electrophoretic properties to the quantum dot. The shell may have a single-layer or multi-layer structure. An interface between the core and the shell may have a concentration gradient in which the concentration of elements existing in the shell is lowered as the distance from a center of the elements decreases. The shell of the quantum dots may include metals or non-metal oxides, semiconductor compounds, or combinations thereof as its representative example.

The metals or non-metal oxides may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, or, NiO, or a ternary compound, such as $MgAl_2O_4$, $CoFe_2O_4$, $NiFe_2O_4$, or $CoMn_2O_4$, however, should not be limited thereto or thereby.

In addition, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, however, should not be limited thereto or thereby.

The quantum dots may have a full width of half maximum ("FWHM") of the light emission wavelength spectrum of about 45 nm or less, such as about 40 nm or less, or such as about 30 nm or less. The color purity and the color reproducibility may be improved within this range. In addition, since the light emitted through the quantum dots may be emitted in all directions, an optical viewing angle may be improved.

In addition, the shape of the quantum dots may have a shape commonly used in the art, however, should not be particularly limited. In more detail, spherical, pyramidal, multi-arm, or cubic nanoparticles, nanotubes, nanowires, nanofibers, nanoplatelets, or the like may be applied to the quantum dots.

The quantum dots may control the color of the light emitted therefrom according to a size thereof, and thus, the quantum dots may have a variety of light emitting colors such as the blue color, the red color, the green color, and the like.

However, the quantum dots should not be limited thereto or thereby, and the first and second color control layers CCF-R and CCF-G may include a scattering particle provided in plural including scattering particles.

In an embodiment, the third color control layer CCF-B may include scattering particles. The scattering particles may be titanium oxide (TiO2) or silica-based nano particles. A second capping layer ENL2 may be commonly disposed in the first, second, and third pixel areas PXA-R, PXA-G, and PXA-B. The second capping layer ENL2 may cover at least one of the first, second, and third color control layers CCF-R, CCF-G, and CCF-B.

As an example, the second capping layer ENL2 may cover the first color control layer CCF-R in the first pixel area PXA-R and a portion of the peripheral area NPXA which is adjacent to the first pixel area PXA-R. Accordingly, the second capping layer ENL2 may be spaced apart from the first capping layer ENL1 by the first color control layer CCF-R and may be in contact with both the first color control layer CCF-R in the first pixel area PXA-R and the portion of the peripheral area NPXA which is adjacent to the first pixel area PXA-R. As being in contact, elements may form an interface therebetween, without being limited thereto.

The second capping layer ENL2 may be in contact with the first capping layer ENL1 in an area other than the first pixel area PXA-R and the portion of the peripheral area NPXA which is adjacent to the first pixel area PXA-R.

The second capping layer ENL2 may include an inorganic material. In an embodiment, the second capping layer ENL2 may include one of the silicon oxide, silicon nitride and the silicon oxynitride.

Referring to FIG. 3C, the first color control layer CCF-R may include a first surface R-U facing the first display layer 100 (e.g., closest to the first display layer 100), a second surface R-B opposite to the first surface R-U and facing the first color filter CF-R (e.g., closest to the first color filter CF-R), and a side surface R-S which connect the first surface R-U and the second surface R-B to each other.

The second color control layer CCF-G may include a first surface G-U facing the first display layer 100, a second surface G-B opposite to the first surface R-U and facing the second color filter CF-G, and a side surface G-S connected to the first surface G-U and the second surface G-B.

According to an embodiment, the capping layers ENL1, ENL2, and ENL3 may encapsulate the first, second, and third color control layers CCF-R, CCF-G, and CCF-B.

According to one or more embodiment, the second capping layer ENL2 and a third capping layer ENL3 may be disposed between the first surface R-U and the first display layer 100 in an area overlapping the first color control layer CCF-R. The second surface R-B of the first color control layer CCF-R may be disposed between the first capping layer ENL1 and the first display layer 100. That is, along a thickness direction within the first pixel area PXA-R the second capping layer ENL2 and the third capping layer ENL3 are on a same side of the first color control layer CCF-R.

The first surface R-U and the side surface R-S of the first color control layer CCF-R may be in contact with the second capping layer ENL2, and the second surface R-B of the first color control layer CCF-R may be in contact with the first capping layer ENL1.

According to an embodiment, the third capping layer ENL3 may be disposed between the first surface G-U and the first display layer 100 in an area overlapping the second color control layer CCF-G. The second surface G-B of the second color control layer CCF-G may be disposed between the first capping layer ENL1 and the second capping layer ENL2, and the first display layer 100. That is, along a thickness direction within the second pixel area PXA-G, the first capping layer ENL1 and the second capping layer ENL2 are on a same side of the second color control layer CCF-G.

The first surface G-U and the side surface G-S of the second color control layer CCF-G may be in contact with the third capping layer ENL3, and the second surface G-B of the second color control layer CCF-G may be in contact with the second capping layer ENL2.

The descriptions of respective capping layers that cover the first surface G-U, the second surface G-B, and the side surface G-S of the second color control layer CCF-G may be applied to the third color control layer CCF-B in the same way.

In an embodiment, within the first pixel area PXA-R, a second-first thickness LB1 of the respective capping layer disposed between the second surface R-B of the first color control layer CCF-R and the first color filter CF-R may be smaller than a first-first thickness LU1 of the respective capping layer disposed between the first surface R-U of the first color control layer CCF-R and the first display layer 100. The first-first thickness LU1 may be defined by a sum of thicknesses of the second and third capping layers ENL2 and ENL3, and the second-first thickness LB1 may be defined by a thickness of the first capping layer ENL1.

In an embodiment, within the third pixel area PXA-B, a second-second thickness LB2 of the respective capping layer disposed between the second surface G-B of the second color control layer CCF-G and the second color filter CF-G may be greater than a first-second thickness LU2 of the respective capping layer disposed between the first surface G-U of the second color control layer CCF-G and the first display layer 100. The first-second thickness LU2 may be defined as the thickness of the third capping layer ENL3, and the second-second thickness LB2 may be defined by a sum of the thickness of the first capping layer ENL1 and the thickness of the second capping layer ENL2.

In an embodiment, the first-first thickness LU1 may be substantially the same as the second-second thickness LB2.

Referring to FIG. 3B again, the third capping layer ENL3 may be disposed on the first, second, and third color control layers CCF-R, CCF-G, and CCF-B. The third capping layer ENL3 may encapsulate the first, second, and third color control layers CCF-R, CCF-G, and CCF-B together with the first capping layer ENL1 and the second capping layer ENL2. The third capping layer ENL3 may be commonly disposed in the first, second, and third pixel areas PXA-R, PXA-G, and PXA-B.

The third capping layer ENL3 may be in contact with the second capping layer ENL2 in the first pixel area PXA-R. The third capping layer ENL3 may be in contact with the second color control layer CCF-G and the third color control layer CCF-B in the second pixel area PXA-G and the third pixel area PXA-B, respectively.

The third capping layer ENL3 may include an inorganic material. In an embodiment, for example, the third capping layer ENL3 may include one of silicon oxide, silicon nitride, and silicon oxynitride.

In an embodiment, the first color control layer CCF-R may be encapsulated by the first capping layer ENL1 and the second capping layer ENL2. The second and third color control layers CCF-G and CCF-B may be encapsulated by the second capping layer ENL2 and the third capping layer ENL3.

The second capping layer ENL2 overlapping the first pixel area PXA-R may be disposed between the first color control layer CCF-R and third capping layer ENL3 and may be in contact with the first color control layer CCF-R and the third capping layer ENL3.

The second capping layer ENL2 overlapping the second and third pixel areas PXA-G and PXA-B may be disposed between the first capping layer ENL1 and each of the second and third color control layers CCF-G and CCF-B, respectively, and may be in contact with the first capping layer ENL1 and each of the second and third color control layers CCF-G and CCF-B, respectively.

Accordingly, the first capping layer ENL1 overlapping the first pixel area PXA-R may be disposed between the first color filter CF-R and the first color control layer CCF-R and may be in contact with the first color filter CF-R and the first color control layer CCF-R.

In addition, the third capping layer ENL3 overlapping the second and third pixel areas PXA-G and PXA-B may be disposed on the second and third color control layers CCF-G and CCF-B and may be in contact with the second and third color control layers CCF-G and CCF-B.

According to an embodiment, the upper display layer 200 may further include the division barrier wall BMW. The division barrier wall BMW may be disposed on the third capping layer ENL3 overlapping the peripheral area NPXA. The division barrier wall BMW may be closer to the first display layer 100 than the third capping layer ENL3. A portion of the division barrier wall BMW may be covered by the third capping layer ENL3. The division barrier wall BMW may include substances absorbing the light. The division barrier wall BMW may extend further toward the first display layer 100 than the third capping layer ENL3 to define an extended portion of the division barrier wall BMW.

Since the division barrier wall BMW is disposed at a position different from that of the division patterns BM1 and BM2 shown in FIG. 3A in a cross-section and has a planar shape different from the division patterns BM1 and BM2 shown in FIG. 3A in a plane, some functions of the division barrier wall BMW may be different from those of the division patterns BM1 and BM2. However, the division barrier wall BMW may be one type of the division patterns BM1 and BM2 in the function of reducing or effectively preventing the color mixture of light emitted at respective pixel areas.

In an embodiment, the first display layer 100 and the second display layer 200 may define the cell gap GP. In one or more embodiments, the cell gap GP is described as an empty space, however, the cell gap GP may be filled with a material and should not be particularly limited. The division barrier wall BMW and the third capping layer ENL3 may be exposed to outside the second display layer 200 at the cell gap GP.

Figure 4:
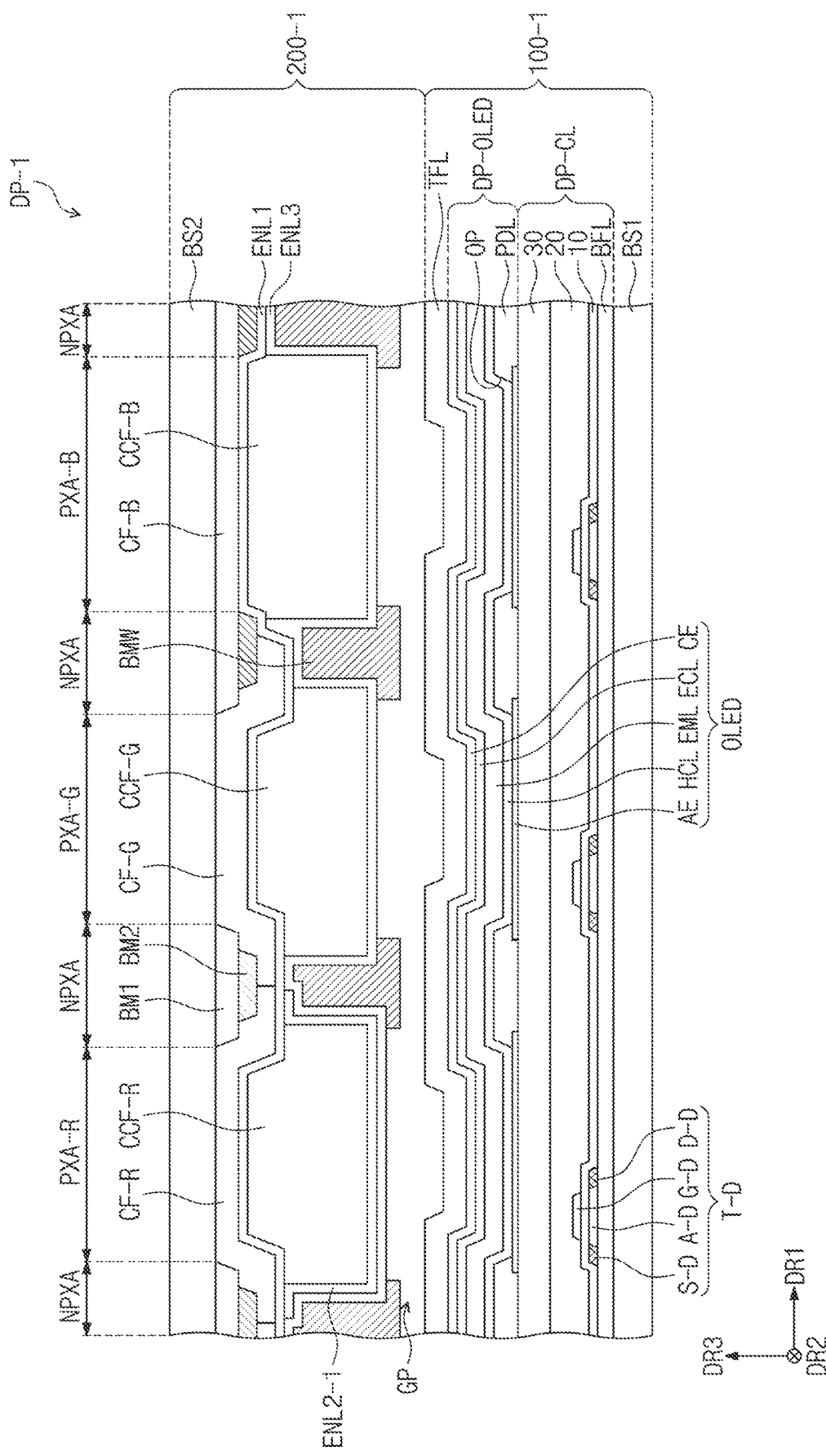
FIG. 4 is a cross-sectional view showing an embodiment of a display panel.

FIG. 4 is a cross-sectional view showing an embodiment of a display panel DP-1. In FIG. 4, the same/similar reference numerals denote the same/similar elements in FIGS. 1A, 1B, 2, and 3A to 3C, and thus, detailed descriptions of the same/similar elements will be omitted.

Referring to FIG. 4, the display panel DP-1 may include a lower display layer 100-1 (herein also base layer 100-1 or a first display layer 100) and an upper display layer 200-1 (herein also a second display layer 200). Base layer 100-1 may include substantially the same elements as those of base layer 100 described with reference to FIG. 3B. Detailed descriptions of base layer 100-1 will be omitted.

According to an embodiment, the upper display layer 200-1 may include a second base layer BS2, division patterns BM1 and BM2 disposed on the second base layer BS2, color filters CF-R, CF-G, and CF-B, color control layers CCF-R, CCF-G, and CCF-B, and a division barrier wall BMW. In addition, the upper display layer 200-1 may further include a plurality of capping layers ENL1, ENL2-1, and ENL3. The upper display layer 200-1 may have a different arrangement between the capping layers ENL1, ENL2-1, and ENL3 and the color control layers CCF-R, CCF-G, and CCF-B from that of the upper display layer 200 described with reference to FIG. 3B, and thus, the different arrangement relation will be mainly described.

A first capping layer ENL1 may be disposed on the color filters CF-R, CF-G, and CF-B. The first capping layer ENL1 may be disposed on the second base layer BS2.

A second capping layer ENL2-1 may be disposed on a first color control layer CCF-R. Different from the second capping layer ENL2 shown in FIG. 3B disposed on an entirety of the first to third color control layers CCF-R, CCF-G, and CCF-B, the second capping layer ENL2-1 may be patterned and may be disposed only on the first color control layer CCF-R in the first pixel area PXA-R. That is, the second capping layer ENL2-1 as a capping layer pattern may be excluded from the second pixel area PXA-G and the third pixel area PXA-B.

A third capping layer ENL3 may be disposed on the color control layers CCF-R, CCF-G, and CCF-B. The first capping layer ENL1 may be disposed on the second base layer BS2.

Referring to FIG. 4, the first color control layer CCF-R may be encapsulated by the first capping layer ENL1 and the second capping layer ENL2-1.

Second and third color control layers CCF-G and CCF-B may be encapsulated by the first capping layer ENL1 and the third capping layer ENL3. Accordingly, the second and third color control layers CCF-G and CCF-B may be spaced apart from the second capping layer ENL2-1 in a direction along the second base layer BS2.

Figure 5:
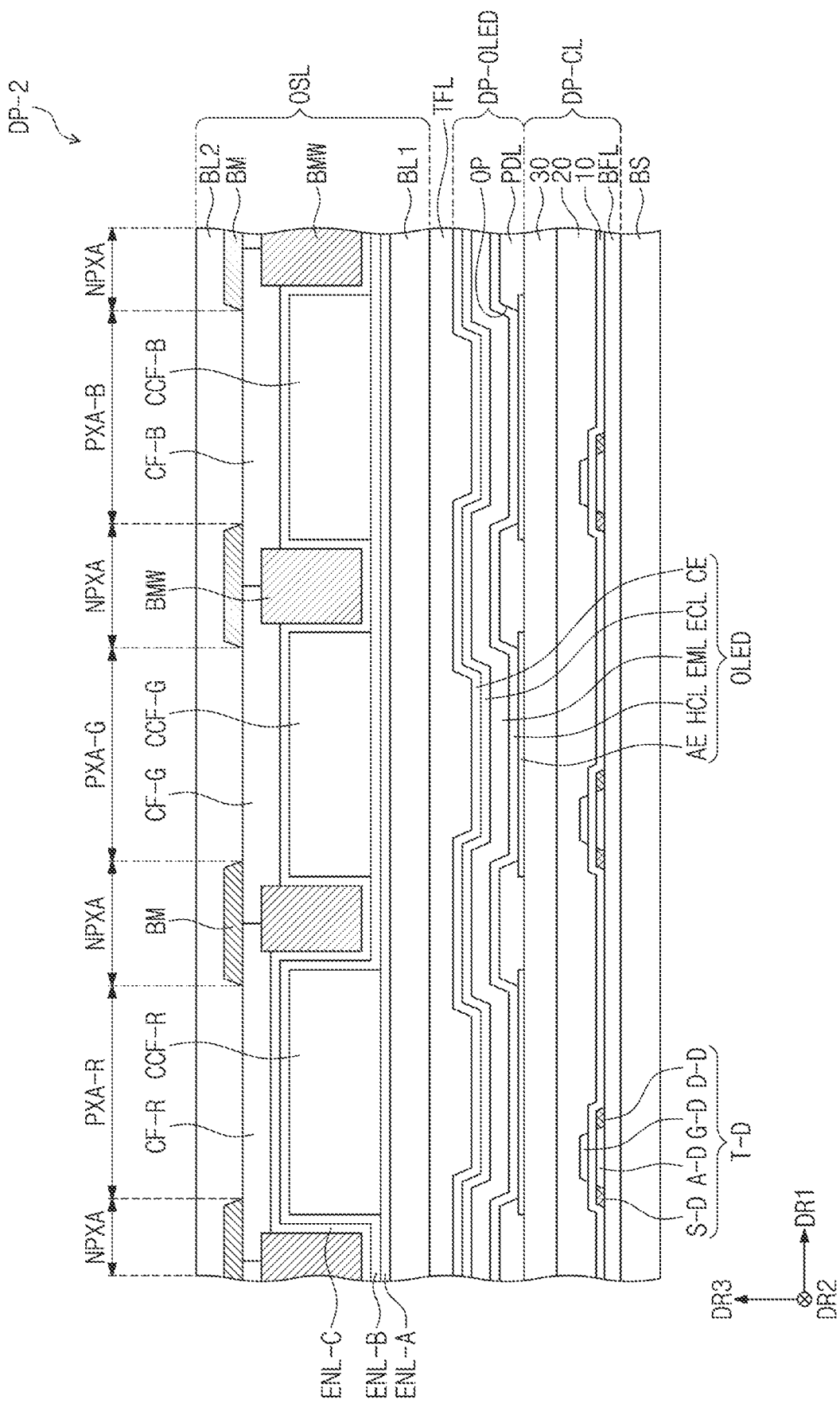
FIG. 5 is a cross-sectional view showing an embodiment of a display panel.

FIG. 5 is a cross-sectional view showing an embodiment of a display panel DP-2. In FIG. 5, the same/similar reference numerals denote the same/similar elements in FIGS. 1A, 1B, 2, and 3A to 3C, and thus, detailed descriptions of the same/similar elements will be omitted.

Referring to FIG. 5, the display panel DP-2 may include a first base layer BS, a circuit element layer DP-CL disposed on the first base layer BS, a display element layer DP-OLED disposed on the circuit element layer DP-CL, and an encapsulation layer TFL disposed on the display element layer DP-OLED. The first base layer BS, the circuit element layer DP-CL, the display element layer DP-OLED, and the encapsulation layer TFL, which are disposed on the first base layer BS, may be substantially the same as those of base layer 100 described with reference to FIG. 3B, and thus, detailed descriptions of the same element will be omitted.

A light control layer OSL may be disposed on the encapsulation layer TFL and form an interface therewith. The light control layer OSL may correspond to the upper display layer 200 described with reference to FIG. 3B. A process for providing the upper display layer 200 is different from a process for providing the light control layer OSL. Different from the upper display layer 200 described with reference to FIG. 3B, which is coupled with base layer 100 after being formed through a separate process, the light control layer OSL of FIG. 5 may be directly formed on the encapsulation layer TFL through successive processes. The encapsulation layer TFL may provide a flat surface.

The light control layer OSL may include a plurality of insulating layers BL1 and BL2, a division barrier wall BMW, color control layers CCF-R, CCF-G, and CCF-B, color filters CF-R, CF-G, and CF-B, and a division pattern BM, which are disposed on the encapsulation layer TFL. In addition, the light control layer OSL may include first, second, and third capping layers ENL-A, ENL-B, and ENL-C.

The insulating layers BL1 and BL2 may include an organic material or an inorganic material. The first insulating layer BL1 may be a planarization layer disposed on the encapsulation layer TFL and providing a flat upper surface. First, second, and third color control layers CCF-R, CCF-G, and CCF-B may be disposed on a first insulating layer BL1 to correspond to first, second, and third pixel areas PXA-R, PXA-G, and PXA-B. The first, second, and third color control layers CCF-R, CCF-G, and CCF-B may absorb a source light generated by a light emitting element OLED and may generate a light having a different color from that of the source light. The first, second, and third color control layers CCF-R, CCF-G, and CCF-B may transmit or scatter a portion of the source light incident thereto.

As an example, the first color control layer CCF-R may absorb a blue light and may generate a red light, and the second color control layer CCF-G may absorb the blue light and may generate a green light. That is, the first color control layer CCF-R and the second color control layer CCF-G may include different quantum dots from each other. The third color control layer CCF-B may transmit the blue light.

The first capping layer ENL-A may be disposed on the first insulating layer BL1. The first capping layer ENL-A may be deposited on the first insulating layer BL1 and may be commonly disposed.

As used throughout the disclosure, the term "basement layer" may be defined as the first insulating layer BL1, however, should not be limited thereto or thereby. The first insulating layer BL1 may be omitted, and in this case, the first capping layer ENL-A may be directly formed on the encapsulation layer TFL as a "basement layer."

In addition, when an inorganic layer which is disposed to be closest to the second capping layer ENL-B among the inorganic layers included in the encapsulation layer TFL, includes the same material as that of the first capping layer ENL-A, the first capping layer ENL-A may be replaced with the inorganic layer of the encapsulation layer TFL, however, should not be particularly limited.

In an embodiment, the first color control layer CCF-R may be covered by the first capping layer ENL-A. Accordingly, the first color control layer CCF-R may be encapsulated by the first capping layer ENL-A and the second capping layer ENL-B.

A portion of the first capping layer ENL-A, which overlaps the first pixel area PXA-R, may be disposed between the first color control layer CCF-R and the first insulating layer BL1 and may be in contact with the first color control layer CCF-R and the first insulating layer BL1.

A portion of the first capping layer ENL-A, which overlaps the second and third pixel areas PXA-G and PXA-B, may be disposed between the first insulating layer BL1 and the second capping layer ENL-B and may be in contact with the first insulating layer BL1 and the second capping layer ENL-B.

The second capping layer ENL-B may be disposed on the first insulating layer BL1. The second capping layer ENL-B may be deposited on the first insulating layer BL1 and may be commonly disposed.

A portion of the second capping layer ENL-B, which overlaps the first pixel area PXA-R, may be disposed between the first color control layer CCF-R and the third capping layer ENL-C and may be in contact with the first color control layer CCF-R the third capping layer ENL-C.

A portion of the second capping layer ENL-B, which overlaps the second and third pixel areas PXA-G and PXA-B, may be disposed between the first capping layer ENL-A and each of the second and third color control layers CCF-G and CCF-B, respectively, and may be in contact with the first capping layer ENL-A and each of the second and third color control layers CCF-G and CCF-B, respectively.

The second and third color control layers CCF-G and CCF-B may be encapsulated by the third capping layer ENL-C and the second capping layer ENL-B.

The third capping layer ENL-C may be disposed on the first insulating layer BL1. The third capping layer ENL-C may be deposited on the first insulating layer BL1 and may be commonly disposed.

A portion of the third capping layer ENL-C, which overlaps the first pixel area PXA-R, may be disposed on the second capping layer ENL-B and may be in contact with the second capping layer ENL-B, and a portion of the third capping layer ENL-C, which overlaps the second and third pixel areas PXA-G and PXA-B, may be disposed on the second and third color control layers CCF-G and CCF-B and may be in contact with the second and third color control layers CCF-G and CCF-B.

The division barrier wall BMW may be disposed on a portion of the second capping layer ENL-B, which overlaps the peripheral area NPXA. A portion of the division barrier wall BMW may be covered by the second capping layer ENL-B, and the other portion of the division barrier wall BMW may be covered by the third capping layer ENL-C. The division barrier wall BMW may include a black coloring agent.

First, second, and third color filters CF-R, CF-G, and CF-B may be disposed on the third capping layer ENL-C to correspond to the first, second, and third pixel areas PXA-R, PXA-G, and PXA-B. The first, second, and third color filters CF-R, CF-G, and CF-B may include a pigment and/or a dye that absorb(s) different wavelength bands from each other. The first color filter CF-R may be a red color filter, the second color filter CF-G may be a green color filter, and the third color filter CF-B may be a blue color filter.

The division pattern BM may be disposed on the first, second, and third color filters CF-R, CF-G, and CF-B overlapping the peripheral area NPXA, however, should not be limited thereto or thereby. According to an embodiment, the division pattern BM may be disposed on the third capping layer ENL-C overlapping the peripheral area NPXA.

The division pattern BM may include a black coloring agent. The black coloring agent may include a black dye or a black pigment. The black coloring agent may include a metal material, such as carbon black, chromium, or the like, or oxides thereof.

A second insulating layer BL2 may cover the first, second, and third color filters CF-R, CF-G, and CF-B and the division pattern BM. The second insulating layer BL2 may include an organic material. Although not shown in figures, a protective substrate may be further disposed on the second insulating layer BL2. The protective substrate may include a plastic substrate or a glass substrate.

Different from the display panel DP described with reference to FIG. 3B, e.g., different from the structure in which base layer 100 and the upper display layer 200 form the cell gap GP and are coupled with each other by the sealant SLM, the light control layer OSL may be formed on the encapsulation layer TFL through successive processes. That is, the cell gap GP between a first display layer 100 and a second display layer 200 of FIG. 3B is essentially omitted in the structure of FIG. 5.

FIGS. 6A to 6F are cross-sectional views showing a method of manufacturing or providing the display panel DP. In FIGS. 6A to 6F, the same/similar reference numerals denote the same/similar elements in FIGS. 1A, 1B, 2, and 3A to 3C, and thus, detailed descriptions of the same/similar elements will be omitted.

The method of providing the display panel DP may include forming the first capping layer ENL1 on the basement layer, performing a first heat-treating process on a basement layer to form the first color control layer CCF-R including the quantum dots, forming the second capping layer ENL2 to encapsulate the first color control layer CCF-R together with the first capping layer ENL1, forming the second color control layer CCF-G including the quantum dots different from the first color control layer CCF-R and the third color control layer CCF-B including the scattering particles above the second capping layer ENL2. That is, the first color control layer CCF-R and the second color control layer CCF-G and/or the third color control layer may be a heat-treated first color control layer, a heat-treated second color control layer and a heat-treated third color control layer, respectively.

In addition, after the forming of the second capping layer ENL2, the third color control layer CCF-B may be formed through a second heat-treating process performed at a temperature of about 230 degrees Celsius (° C.), and after the forming of the third color control layer CCF-B, the second color control layer CCF-G may be formed through a third heat-treating process performed at a temperature of about 180° C.

In addition, after the forming of the second capping layer ENL2, at least one of the second color control layer CCF-G and the third color control layer CCF-B may be formed through a heat-treating process. Hereinafter, the method of providing the display panel DP will be described in detail with reference to FIGS. 6A to 6F.

Figure 6A:
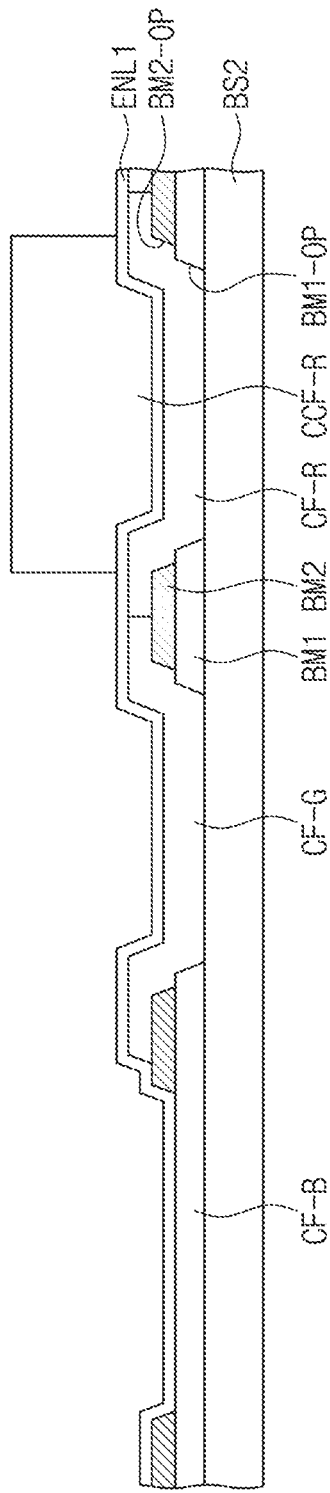

Referring to FIG. 6A, the manufacturing method of the display panel DP may include providing a second base layer BS2. The division patterns BM1 and BM2 through which the openings BM1-OP and BM2-OP are defined, the color filters CF-R, CF-G, and CF-B formed to correspond to the openings BM1-OP and BM2-OP, the first capping layer ENL1 covering the color filters CF-R, CF-G, and CF-B, and the first color control layer CCF-R formed on the first capping layer ENL1 to correspond to the first color filter CF-R, may be provided on the second base layer BS2.

The first capping layer ENL1 may be formed on the second base layer BS2 by a chemical vapor deposition ("CVD") process.

The first color control layer CCF-R may be formed by a photoresist process. In an embodiment, as an example, the first color control layer CCF-R (e.g., heat-treated first color control layer) may be formed by coating an initial composition including quantum dots on the first capping layer ENL1 overlapping the first color filter CF-R and performing an exposure process, a development process, and the first heat-treating process under a nitrogen ($N_2$) condition.

Figure 6B:
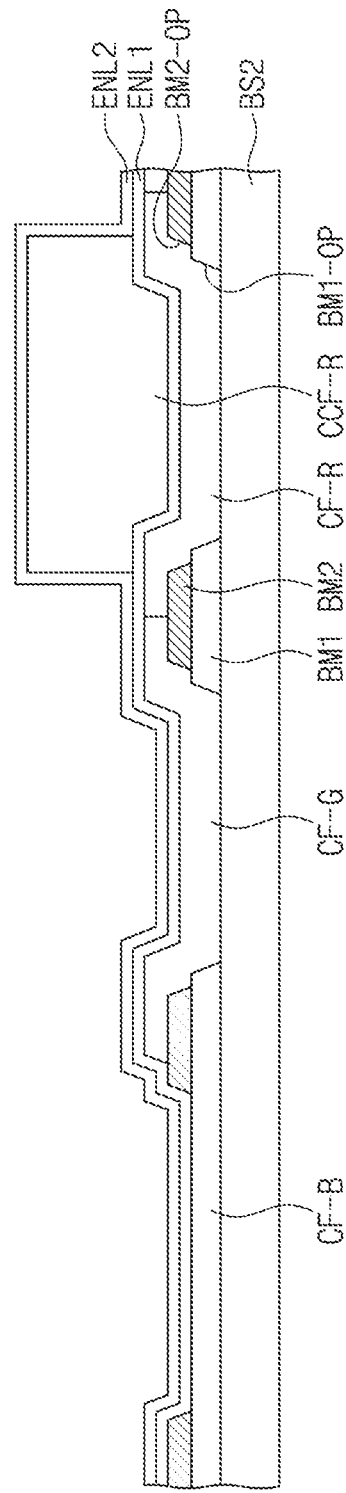

Referring to FIG. 6B, the method of providing the display panel DP may include the forming of the second capping layer ENL2.

The second capping layer ENL2 may be formed on the second base layer BS2 by a chemical vapor deposition ("CVD") process. The second capping layer ENL2 may cover the first color control layer CCF-R. Accordingly, the first color control layer CCF-R may be encapsulated by the first capping layer ENL1 and the second capping layer ENL2.

Referring to FIG. 6C, the method of providing the display panel DP may include the forming of the third color control layer CCF-B. The third color control layer CCF-B may be formed through a photoresist process. In an embodiment, for example, the third color control layer CCF-B (e.g., heat-treated third color control layer) may be formed by coating an initial composition including scattering particles on the second capping layer ENL2 overlapping the third color filter CF-B and performing an exposure process, a development process, and the second heat-treating process at a temperature. The temperature may be about 230° C., and a bake process may be performed for about 20 minutes.

During the bake process for the third color control layer CCF-B, heat may also be applied to the first color control layer CCF-R. In this case, an efficiency of the first color control layer CCF-R may increase due to heat or light energy.

Referring to FIG. 6D, the method of providing the display panel DP may include the forming of the second color control layer CCF-G. The second color control layer CCF-G may be formed through a photoresist process. In an embodiment, as an example, the second color control layer CCF-G (e.g., heat-treated second color control layer) may be formed by coating an initial composition including quantum dots on the second capping layer ENL2 overlapping the second color filter CF-G and performing an exposure process, a development process, and the third heat-treating process at a temperature. The temperature may be about 180° C., and a bake process may be performed for about 20 minutes.

During the bake process for the second color control layer CCF-G, heat may also be applied to the first color control layer CCF-R. In this case, the efficiency of the first color control layer CCF-R may increase due to heat or light energy.

Referring to FIG. 6E, the method of providing the display panel DP may include the forming of the third capping layer ENL3.

The third capping layer ENL3 may be formed on the second base layer BS2 by a chemical vapor deposition ("CVD") process. The third capping layer ENL3 may cover the first, second, and third color control layers CCF-R, CCF-G, and CCF-B. Accordingly, the second and third color control layers CCF-G and CCF-B may be encapsulated by the second capping layer ENL2 together with the third capping layer ENL3.

Referring to FIG. 6F, the method of providing the display panel DP may further include forming the division barrier wall BMW.

The division barrier wall BMW may be respectively disposed between the first, second, and third color control layers CCF-R, CCF-G, and CCF-B and may be partially covered by the third capping layer ENL3. The division barrier wall BMW may include the same material as one of the division patterns BM1 and BM2. The division barrier wall BMW may be formed by coating a material including a black coloring agent on the third capping layer ENL3 overlapping the division patterns BM1 and BM2 and performing a bake process at a temperature. The temperature may be about 180° C., and the bake process may be performed for about 20 minutes.

During the bake process for the division barrier wall BMW, heat may also be applied to the first color control layer CCF-R. In this case, the efficiency of the first color control layer CCF-R may increase due to heat or light energy.

According to one or more embodiment, after the upper display layer 200 is formed, a high temp operating life ("HTOL") test may be carried out at a high temperature to evaluate a performance of the first, second, and third color control layers CCF-R, CCF-G, and CCF-B.

In this case, the efficiency of the first color control layer CCF-R which is changed due to the heat or light energy, may be uniformly maintained or slightly reduced during the high temp operating life ("HTOL") test due to the previously-performed heat-treating processes. Accordingly, the first color control layer CCF-R that absorbs the blue light and generates the red light may have a stable efficiency during the high temp operating life ("HTOL") test. Accordingly, the reliability of the display panel DP may be improved.

Although embodiments have been described, it is understood that the invention should not be limited to these embodiments but various changes and modifications can be made by one ordinary skilled in the art within the spirit and scope of the invention as hereinafter claimed.

Therefore, the disclosed subject matter should not be limited to any single embodiment described herein, and the scope of the invention shall be determined according to the attached claims.

What is claimed is:

1. A display panel comprising:
   a display layer comprising a light emitting element generating a source light;
   a first color filter facing the display layer;
   a first color control layer between the display layer and the first color filter and the first color control layer comprising a first surface closest to the display layer and a second surface closest to the first color filter; and
   a plurality of capping layers which encapsulates the first color control layer,
   wherein the plurality of capping layers comprises:
   a first-first thickness which is between the first surface of the first color control layer and the display layer, and
   a second-first thickness which is between the second surface of the first color control layer and the first color filter and different from the first-first thickness.

2. The display panel of claim 1, wherein the plurality of capping layers further comprises:
   a first capping layer, a second capping layer and a third capping layer, and
   at the first color control layer:
   the first capping layer between the second surface of the first color control layer and the first color filter and defines the second-first thickness,
   the second capping layer and the third capping layer both between the first surface of the first color control layer and the display layer and define the first-first thickness, and
   the second-first thickness smaller than the first-first thickness.

3. The display panel of claim 2, further comprising:
   a second color filter spaced apart from the first color filter; and
   a second color control layer corresponding to the second color filter, receiving the source light, providing a light different from a light generated by the first color control layer, and comprising a first surface closest to the display layer and a second surface closest the second color filter,
   wherein the plurality of capping layers further comprises:
   the first capping layer and the second capping layer extended from the first color control layer to the second color control layer and between the second surface of the second color control layer and the second color filter, and
   the third capping layer extended from the first color control layer to the second color control layer and between the first surface of the second color control layer and the display layer.

4. The display panel of claim 3, wherein the plurality of capping layers further comprises at the second color control layer:
   the third capping layer between the first surface of the second color control layer and the display layer defining a first-second thickness,
   the first capping layer and the second capping layer between the second surface of the second color control layer and the second color filter defining a second-second thickness, and
   the second-second thickness greater than the first-second thickness.

5. The display panel of claim 3, wherein each of the first color control layer and the second color control layer comprises a quantum dot.

6. The display panel of claim 3, further comprising: a third color filter spaced apart from the first color filter and the second color filter in the direction along the display layer; and
   a third color control layer which corresponds to the third color filter and receiving the source light, providing a light different from a light generated by the first color control layer and the second color control layer.

7. The display panel of claim 6, further comprising:
   the first color control layer, the second color control layer and the third color control layer which are spaced apart from each other defining a space respectively therebetween, and
   a division pattern corresponding to the space.

8. The display panel of claim 7, wherein the division pattern comprises a same material as the third color filter.

9. The display panel of claim 6, further comprising:
   the first color control layer, the second color control layer and the third color control layer which are spaced apart from each other defining a space respectively therebetween, and
   a division barrier wall extended into the space from outside the first color control layer, the second color control layer and the third color control layer.

10. The display panel of claim 1, wherein within the plurality of capping layers, the second-first thickness is smaller than the first-first thickness.

11. A display panel comprising:
    a display layer comprising a light emitting element generating a source light;
    a color filter layer facing the display layer and the color filter layer comprising a first color filter and a second color filter spaced apart from each other along the display layer;
    a color control layer between the display layer and the color filter layer and comprising a first color control layer corresponding to the first color filter and a second color control layer corresponding the second color filter; and
    a plurality of capping layers encapsulating the first color control layer and the second color control layer, wherein
each of the first color control layer and the second color control layer comprises a first surface closest to the display layer and a second surface opposing the first surface, and
the plurality of capping layers comprises:
  a second-first thickness which is between the second surface of the first color control layer and the first color filter, and
  a second-second thickness which is between the second surface of the second color control layer and the second color filter and different from the second-first thickness.

12. The display panel of claim 11, wherein the plurality of capping layers further comprises:
  a first capping layer, a second capping layer and a third capping layer,
  the first capping layer between the second surface of the first color control layer and the first color filter and between the second surface of the second color control layer and the second color filter, and
  the second capping layer between the first surface of the first color control layer and the display layer and between the second surface of the second color control layer and the first capping layer.

13. The display panel of claim 12, wherein the plurality of capping layers further comprises the third capping layer:
  between the second capping layer and the display layer and corresponding to the first color control layer, and
  between the first surface of the second color control layer and the display layer and corresponding to the second color control layer.

14. The display panel of claim 13, wherein within the plurality of capping layers, the second-first thickness is smaller than the second-second thickness.

15. The display panel of claim 14, wherein the plurality of capping layers further comprises:
  a first-first thickness between the first surface of the first color control layer and the display layer,
  a first-second thickness between the first surface of the second color control layer and the display layer, and
  the first-first thickness greater than then first-second thickness.

16. The display panel of claim 15, wherein within the plurality of capping layers, the first-first thickness is equal to the second-second thickness.

17. The display panel of claim 16, wherein each of the first color control layer and the second color control layer comprises a quantum dot.

* * * * *